United States Patent [19]

Yamasaki et al.

[11] Patent Number: 5,291,454
[45] Date of Patent: Mar. 1, 1994

[54] CIRCUIT FOR DECREASING CURRENT CONSUMPTION IN DATA OUTPUT CIRCUIT IN CASE ONE OF TWO SUPPLY VOLTAGES FAILS

[75] Inventors: Kyoji Yamasaki; Yutaka Ikeda, both of Hyogo, Japan

[73] Assignee: Mitsubishi Denki Kabushiki Kaisha, Tokyo, Japan

[21] Appl. No.: 824,626

[22] Filed: Jan. 23, 1992

[30] Foreign Application Priority Data

May 20, 1991 [JP] Japan .................. 3-114869

[51] Int. Cl.⁵ .............................................. G11C 3/00
[52] U.S. Cl. ...................................... 365/226; 365/227
[58] Field of Search ............... 365/226, 227, 228, 229, 365/189.06, 189.09; 307/296.6, 296.8, 296.1

[56] References Cited

U.S. PATENT DOCUMENTS

| | | | |
|---|---|---|---|
| 4,654,829 | 3/1987 | Jiang | 365/226 |
| 4,933,902 | 6/1990 | Yamada | 365/226 |
| 4,972,374 | 11/1990 | Wang | 365/227 |
| 5,047,988 | 9/1991 | Mizuta | 307/296.6 |
| 5,101,119 | 3/1992 | Yoshimori | 365/240 |
| 5,132,932 | 7/1992 | Tobita | 365/226 |

*Primary Examiner*—Eugene R. LaRoche
*Assistant Examiner*—A. Zarabian
*Attorney, Agent, or Firm*—Lowe, Price, LeBlanc & Becker

[57] ABSTRACT

An improved output buffer circuit applicable to dynamic random access memories (DRAms) is disclosed. First power supply voltage Vcc1 is supplied to a conventional output main amplifier 3ai. Second power supply voltage Vcc2 is supplied to output driver circuit 4i. Potential fixing circuit 3bi operated in response to power supply failure detecting signal PFR of first power supply voltage Vcc1 is connected to the output of output main amplifier circuit 3ai. When second power supply voltage Vcc2 is applied without first power supply voltage Vcc1 being supplied, the gates of driving transistors Q1 and Q2 are fixed to ground potential in response to the signal PFR. Consequently, undesired current consumption is avoided, since a penetrating current does not flow through transistors Q1 and Q2.

8 Claims, 6 Drawing Sheets

CIRCUIT FOR DECREASING CURRENT CONSUMPTION IN DATA OUTPUT CIRCUIT IN CASE ONE OF TWO SUPPLY VOLTAGES FAILS

BACKGROUND OF THE INVENTION

1. Field of the Invention

The present invention generally relates to semiconductor memory devices, and more particularly to a semiconductor memory device supplied with an additional power supply voltage for a data output driving circuit. The present invention has particular applicability to Dynamic Random Access Memories (DRAMs).

2. Description of the Background Art

Recently, high integration of a semiconductor memory has been realized, and storage capacity of the semiconductor memory has been increased. The demand for the semiconductor memory having multi-bits configuration is increased as the storage capacity increases. The semiconductor memory having multi-bits configuration can handle data, for example, in 1 byte (8 bits) or 2 bytes 2.0 (16 bits) unit. It means that the semiconductor memory having multi-bits configuration can simultaneously read and write a plurality of bits of data.

Generally, a number of semiconductor memories are placed on a printed circuit load (memory board), and their data output terminals are connected to data buses. Accordingly, when data stored in a semiconductor memory is read out, the semiconductor memory drives a data bus (load) connected to a data output terminal in response to the read out data signal. In order to drive the data bus, the semiconductor memory comprises at its output stage a driving circuit for driving the data bus. Generally, the load which must be driven by the driving circuit is large, since the long data bus is provided on the memory board. Therefore, the driving circuit is constructed by a transistor having large current driving capability.

Since the driving circuit provided within the semiconductor memory needs to drive such a large load as mentioned above, it consumes much current, i.e. power. When a single power supply voltage is supplied not only to the primary circuits constituting the semiconductor memory, namely, a memory cell array and a sense amplifier, but to the driving circuit, a power supply voltage level is decreased by current consumption in the driving circuit. The decrease of the power supply voltage causes malfunction of the primary circuits in the semiconductor memory. Recently, for the purpose of preventing the decrease of the power supply voltage supplied to the primary circuits, additional power supply voltage for the driving circuit is applied to the semiconductor memory. Therefore, although the driving circuit consumes much current, malfunction of the primary circuits in the semiconductor memory caused by that current consumption can be avoided.

Furthermore, the semiconductor memory supplied with two power supply voltages also has an advantage in view of noise control as mentioned in the following description. When a single power supply voltage is supplied, it is difficult to transmit noise generated in the driving circuit to the power supply, that is,, noise hardly escapes, since impedance of a gold line connected between a power supply lead and a bonding pad formed in the semiconductor substrate is high. Therefore, in this case, peripheral circuits in the semiconductor memory are easily affected by noise. However, when two or more power supply voltages are supplied, noise generated in the driving circuit is easily transmitted to the power supply, that is, from the semiconductor memory to outside (noise easily escapes). As a result, peripheral circuits in the semiconductor memory are rarely affected by noise.

In view of the advantages mentioned above, two or more power supply voltages are applied to recent semiconductor memories having multi-bits configurations. A plurality of power supply voltages are supplied to the semiconductor memory through a plurality of power supply lines provided on the memory board, but their timings are often different from each other, because the plurality of power supply lines have different lengths and hence different impedances. As a result, even if a plurality of power supply voltages are simultaneously provided to the memory board, the timings of these power supply voltages supplied to the semiconductor memory often differ. It should be noted that, depending on the situation, there may be a case where one of a plurality of power supply voltages is not supplied because of some failure.

In the following description, at first the semiconductor memory will be described. Next, there will be a description of possible problems caused when the timings of a plurality of power supply voltages differ, or when one of the power supply voltages is not applied. The present invention is generally applicable to the semiconductor memories, and a dynamic random access memory (referred to as "DRAM" hereinafter) will be described as one example in the following description.

FIG. 5 is a block diagram of a conventional DRAM. Referring to FIG. 5, the DRAM 1a comprises a primary circuit 2a energized by an externally applied first power supply voltage Vcc1, and an output driving circuit 4 energized by a second power supply voltage Vcc2. Primary circuit 2a comprises a memory cell array 60 including. memory cells arranged in rows and columns, an address input buffer 63 for receiving externally applied address signals A0 to Am, a row decoder 61 for decoding a row address signal RA, a column decoder 62 for decoding a column address signal CA, and a sense amplifier 64 for amplifying data signals read out from memory cells. Sense amplifier 64 is connected to an output buffer circuit 3a and to an input latch circuit 65 through an IO line.

A clock signal generator 67 generates various control signals for controlling DRAM 1a in response to an externally applied row address strobe signal /RAS and a column address strobe signal /CAS. An OE buffer 68 receives an externally applied output enable signal /OE to provide a signal OEM. A power on reset circuit 69 is supplied with power supply voltage Vcc1 to generate a power on reset signal (referred to as "PORI, hereinafter).

Output driving circuit 4 is supplied with second power supply voltage Vcc2 to drive a load connected to I/O terminals DQl to DQn, namely, a data bus DB in response to n-bit data signals generated from output buffer circuit 3a. I/O latch circuit 65 is connected to I/O terminals DQl to DQn through a bypass line bypassing output driving circuit 4.

In write operation, since a write enable signal /W falls, n bit data signals applied through terminals DQl to DQn are latched in latch circuit 65. The latched signals are written into the memory cell designated by external address signals A0 to Am. In read operation, n-bit stored data signals are read out from the memory cell designated by external address signals AO to Am. output buffer circuit 3a applies n-bit data signals to output driving circuit 4 in response to output enable signal /OE. Output driving circuit 4 drives data bus DB connected to terminals DQl to DQn in response to the applied data signals.

FIG. 6 is a circuit diagram of an output main amplifier 3ai provided in an output buffer circuit 3a and a circuit 4i provided in output driving circuit 4 shown in FIG. 5. Circuits 3ai and 4i handle 1 bit read out data signal, namely, an ith data signal RDi. In other words, output buffer circuit 3a and output driving circuit 4 shown in FIG. 5 comprise n-circuits 3ai and 4i shown in FIG. 6.

Referring to FIG. 6, a first stage circuit 5 comprises PMOS transistors 11 and 12, and NMOS transistors 13 and 14 connected in series between power supply voltage Vcc1 and ground Vss1. The ith read out data signal RDi is applied to the gates of transistors 12 and 13 constituting an inverter. First stage circuit 5 is activated in response to data obtaining signals DOT and /DOT generated from clock signal generator 67 shown in FIG. 5, to apply read out data signal RDi t-o a latch circuit 6. Latch circuit 6 comprises two cross coupled CMOS inverters. One CMOS inverter is constructed by a PMOS transistor 15 and an NMOS transistor 16. The other CMOS inverter is constructed by a PMOS transistor 17 and an NMOS transistor 18. Latch circuit 6 applies mutually inverted two signals to a CMOS inverter constructed by a PMOS transistor 19 and an NMOS transistor 20, and to a CMOS inverter constructed by a PMOS transistor 21 and an NMOS transistor 22. These two signals provided from the two CMOS inverters are applied to output timing control circuits 7 and 8, respectively.

Output timing control circuit 7 is constructed by PMOS transistors 23 and 24, and NMOS transistors 25 and 26. When externally applied output enable signal /OE is at a low level, an OE buffer 68 shown in FIG. 5 provides a high level signal OEM. Transistors 24 and 25 are turned off and on, respectively, in response to signal OEM. Accordingly, at this time, output timing control circuit 7 transmits the signal applied to an input node N1 to CMOS inverter 9. When output enable signal /OE is at a high level, transistors 24 and 25 are turned on and off, respectively. Accordingly, at this time, circuit 7 applies a high level signal S2 to inverter 9. Inverter 9 applies a low level signal S1 to driver circuit 4i in response to the applied high level signal.

Output timing control circuit 8 has the same circuit configuration and operates in the same manner as circuit 7. Accordingly, when a high level signal OEM is applied, circuit 8 applies to CMOS inverter 10 an inverted one of the signal applied to a node N2. Therefore, at this time, inverter 10 provides inverted signal S2 and applies it to driving circuit 4i. Since transistors 28 and 29 are turned on and off, respectively when signal OEM is at a low level, CMOS inverter 10 provides a low level signal S2.

Driving circuit 4i comprises NMOS transistors Q1 and Q2 connected in series between second power supply voltage Vcc2 and ground Vss2. A common connection node of transistors Q1 and Q2 is connected to ith data I/O terminal DQi. When output enable signal /OE is at a low level, mutually inverted data signals S1 and S2 are applied to transistors Q1 and Q2, respectively, in response to a high level signal OEM. Consequently, either one of transistors Q1 and Q2 is turned on, and either one of the potential Vcc2 and Vss2 in response to ith readout data RDi is provided through terminal DQi.

When second power supply voltage Vcc2 is applied without any supply of first power supply voltage vcc1, there will be a problem as mentioned in the following description. When first power supply voltage Vcc1 is not applied, output signals S1 and S2 of inverters 9 and 10 indicate an unstable potential. Accordingly, conductive/non conductive state of transistors Q1 and Q2 in driving circuit 4i become unstable. As a result, current consumption is increased, because a penetrating current flows from power supply voltage Vcc2 to ground Vss2 through transistors Q1 and Q2. Depending on the situation, transistors Q1 and Q2 may be damaged because of excessive penetrating current.

Furthermore, because output terminal DQi is connected to Vcc2 or Vss2 through transistors Q1 or Q2 having a low resistance, other circuits or devices connected to output terminal DQi will have an unpreferable influence.

SUMMARY OF THE INVENTION

One object of the present invention is to decrease the current consumed when main power supply voltage is not applied in a semiconductor memory device including a data output driving circuit supplied with an additional power supply voltage.

Another object of the present invention is to prevent a data output driving circuit from being destructed by an excessive current flowing through the circuit, when main power supply voltage is not applied in the semiconductor memory device including a data output driving circuit supplied with an additional power supply voltage.

Another object of the present invention is to decrease the current consumed when main power supply voltage is not applied in a dynamic random access memory device including a data output driving circuit supplied with an additional power supply voltage.

Yet another object of the present invention is to prevent a data output driving circuit from being destructed by an excessive current flowing through the circuit, when main power supply voltage is not applied in a dynamic random access memory device including the data output driving circuit supplied with an additional power supply voltage.

In short, a semiconductor memory device of the present invention includes memory cells arranged in rows and columns, an amplifier receiving an external first power supply voltage for amplifying a data signal read out from the memory cells and for providing an amplified signal, a data output terminal, a driving circuit supplied with an external second power supply voltage for driving a load connected to the data output terminal in response to the amplified signal, a power supply failure detecting circuit applied with the second power supply voltage and for detecting failure of the first power supply voltage in response to the first power supply voltage, and a potential fixing circuit for fixing the potential of the amplified signal provided from the amplifier to a predetermined potential.

In operation, the amplifier may provide an unstable output signal having unstable potential when the first power supply voltage is not applied. The driving circuit consumes more current when the amplifier provides the unstable output signal. However, the power supply failure detecting circuit detects failure of the first power supply voltage, and the potential fixing circuit fixes the potential of the amplified signal provided from the amplifier in response to failure of the power supply. Consequently, since the driving circuit receives the amplified signal having a predetermined potential instead of the unstable output signal, current consumption is decreased in the driving circuit.

In accordance with another aspect of the present invention, a semiconductor memory device having n-bits configurations includes memory cells arranged in rows and columns, n-amplifiers receiving an external first power supply voltage for amplifying n-data bit signals read out from the memory cells and for providing the amplified signals, n-data output terminal, n-driving circuits for driving loads connected to corresponding data output terminals in response to the amplified signals provided from the corresponding amplifier, a power supply failure detecting circuit receiving a second power supply voltage for detecting failure of the first power supply voltage in response to the first power supply voltage, and a potential fixing circuit for fixing the potential of n amplified signals provided from n amplifiers in response to the power supply failure detecting circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
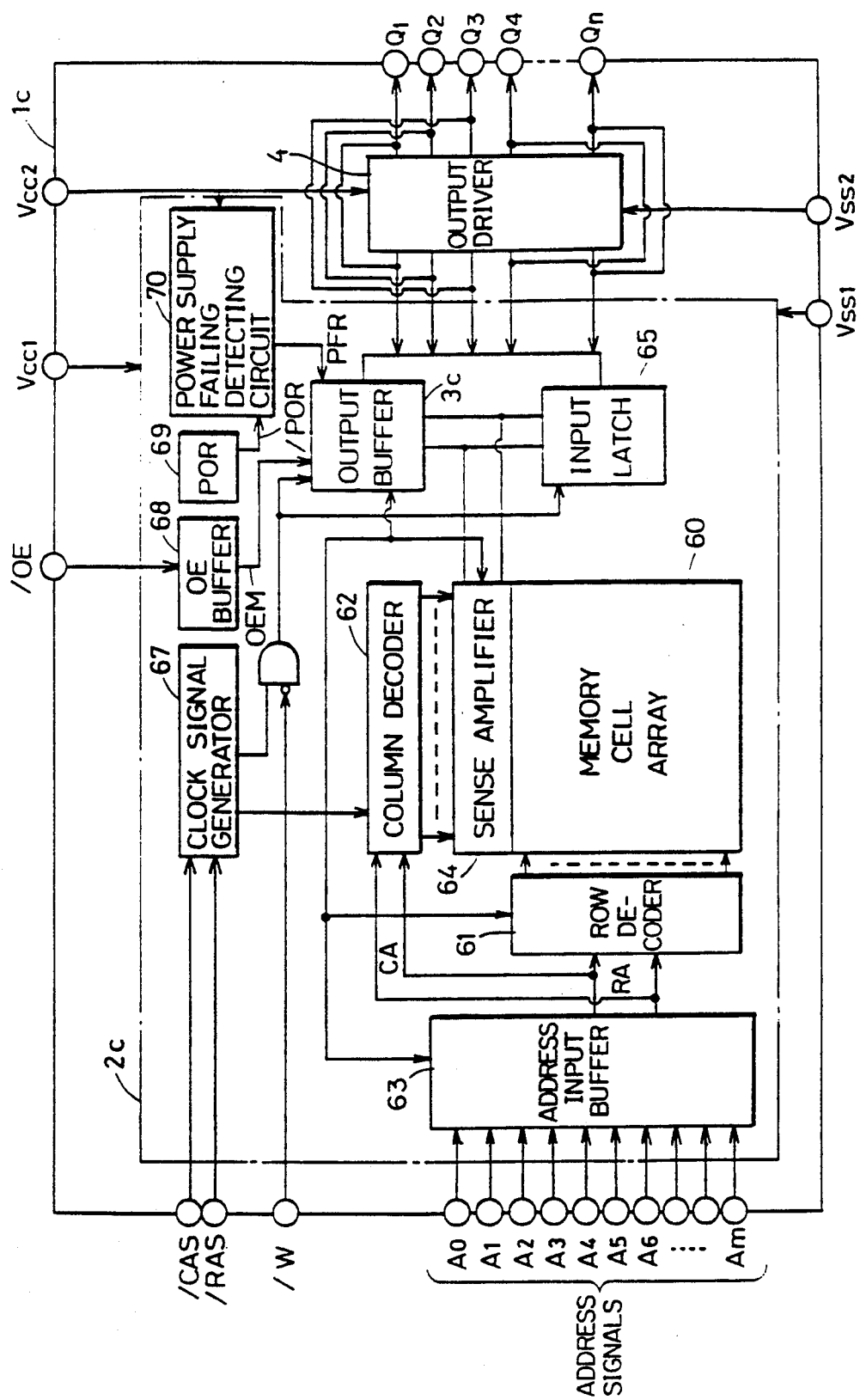
FIG. 2 is a block diagram of a DRAM showing one embodiment of the present invention.
Figure 5:
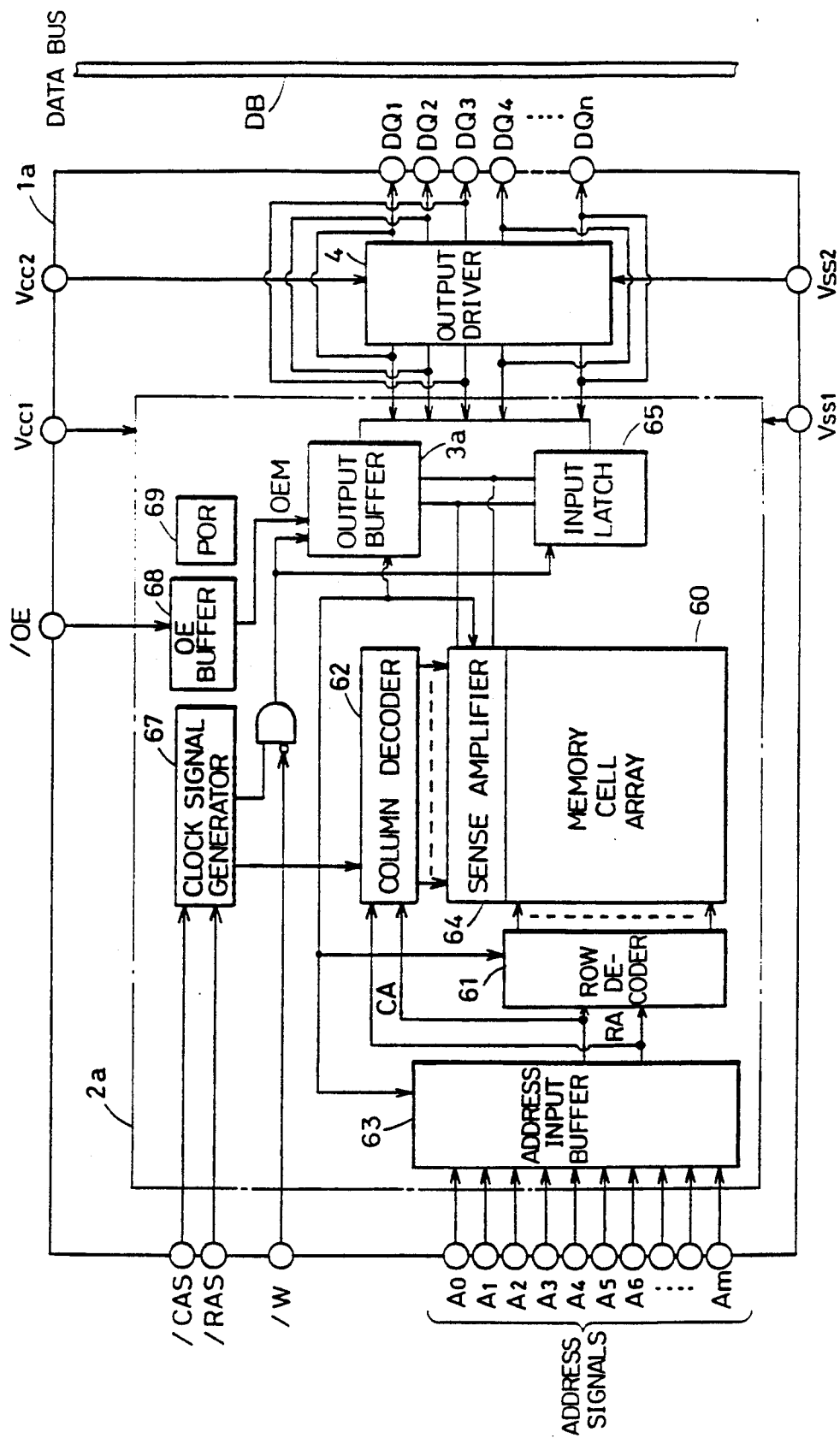
FIG. 5 is a block diagram of a conventional DRAM.

Referring to FIG. 2, DRAM 1c comprises an improved output buffer 3c and a newly provided power supply failure detecting circuit 70, as compared with the conventional one 1a shown in FIG. 5. Power supply failure detecting circuit 70 is supplied with second power supply voltage Vcc2, and receives a power on reset signal /POR generated from a power on reset (POR) circuit 69. Power supply failure detecting circuit 70 generates a power supply failure detecting signal PFR indicating whether first power supply voltage Vcc1 is failed or not in response to the applied signal /POR, and applies it to output buffer 3c. POR circuit 69 is supplied with first power supply voltage Vcc1 to generate signal /POR in response to the start of the supply of power supply voltage Vcc1. Since other circuits of DRAM 1c have the same configuration as the conventional one 1a shown in FIG. 5, the description is not repeated.

Figure 1:
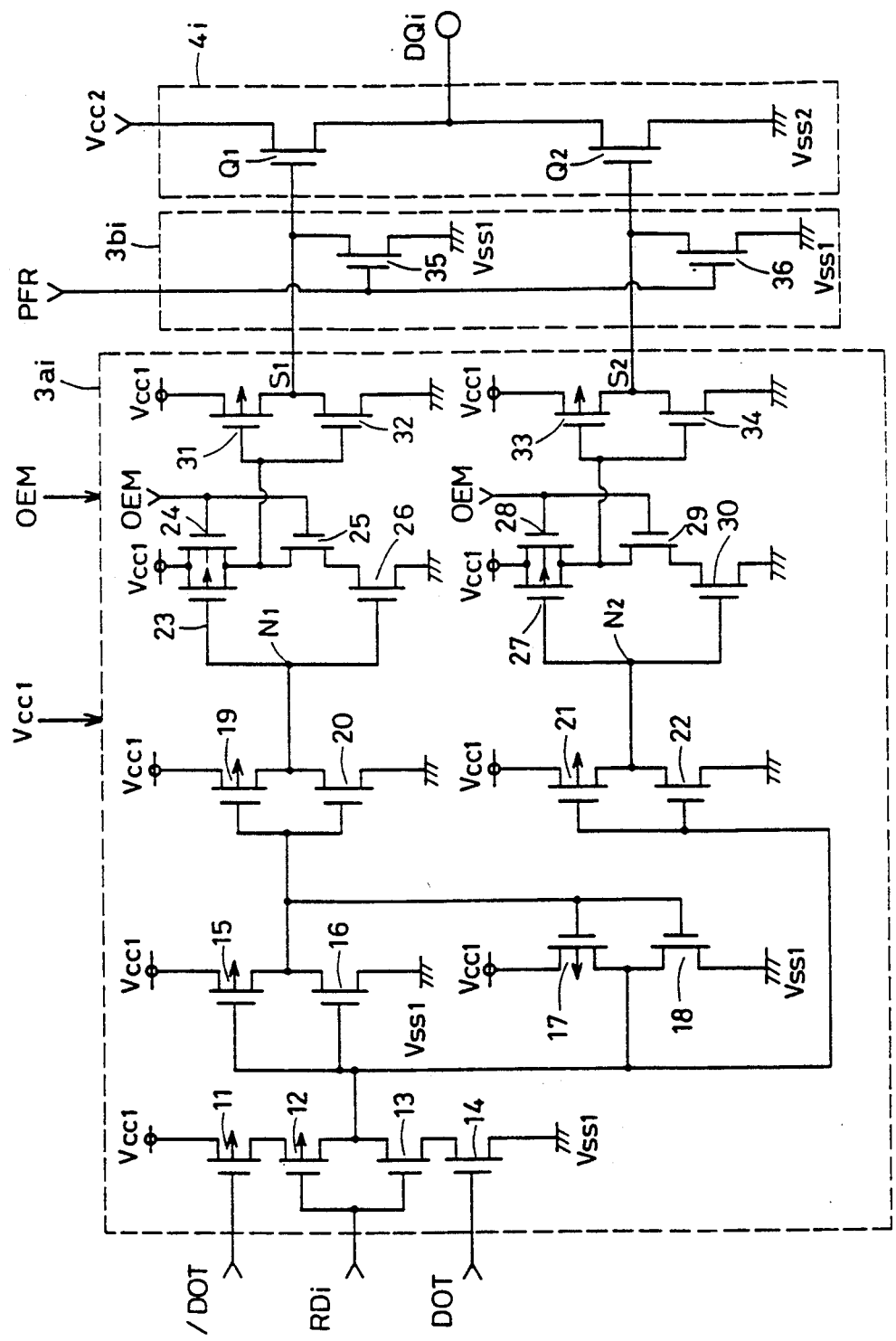
FIG. 1 is a circuit diagram of an improved output buffer circuit shown in FIG. 2.
Figure 6:
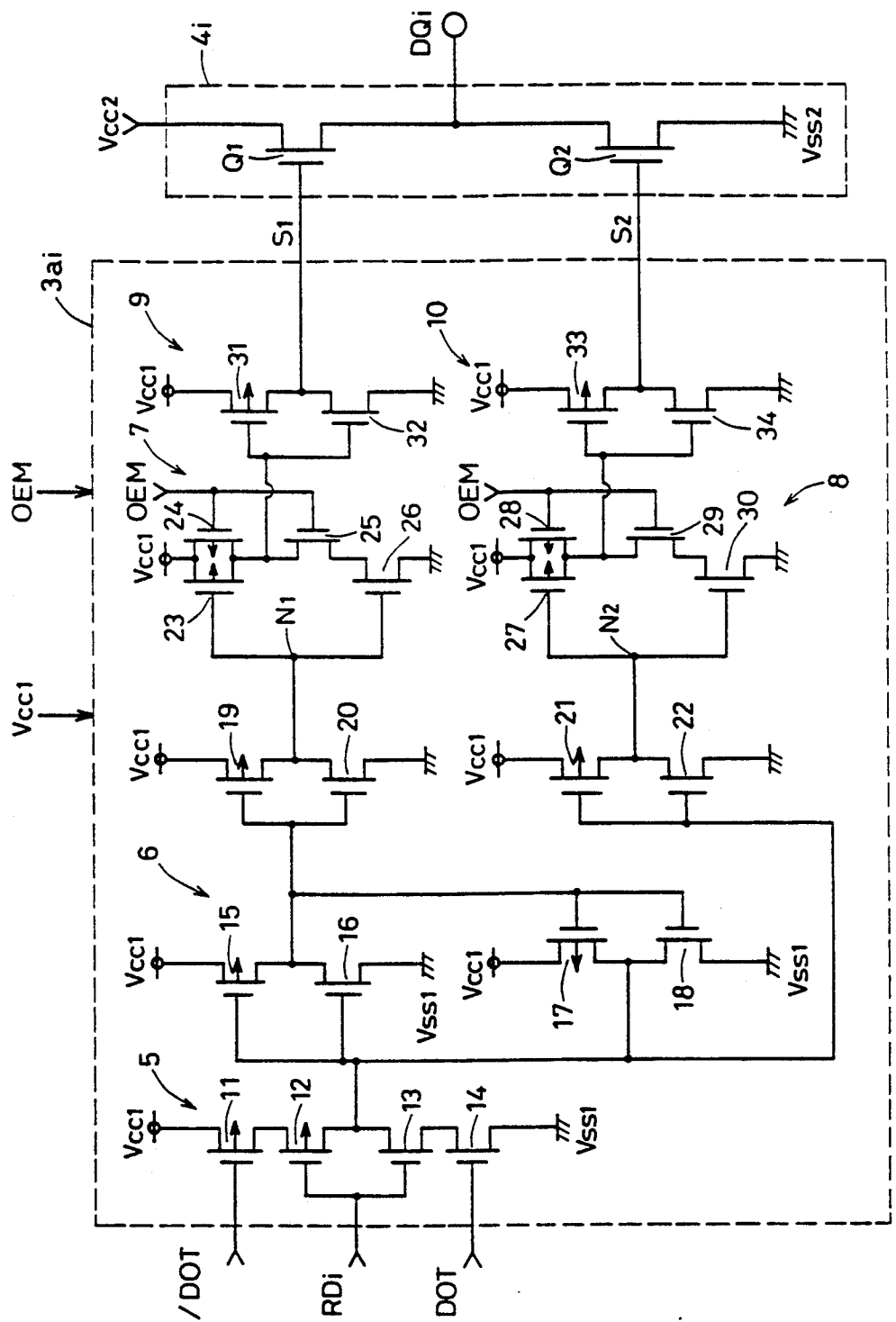
FIG. 6 is a circuit diagram of an output main amplifier circuit and an output driving circuit provided within the output buffer circuit shown in FIG. 5.

FIG. 1 is a circuit diagram of an improved output buffer circuit shown in FIG. 2. Referring to FIG. 1, a potential fixing circuit 3bi connected to the output of an output main amplifier circuit 3ai is added, as compared with a conventional circuit shown in FIG. 6. Potential fixing circuit 3bi is operated in response to a power supply failure detecting signal PFR generated from power supply failure detecting circuit 70 shown in FIG. 2. Potential fixing circuit 3bi comprises NMOS transistors 35 and 36 connected between corresponding gates of NMOS transistors Q1 and Q2 provided within a driving circuit 4i and group Vss1. Transistors 35 and 36 have their gates connected to receive power supply failure detecting signal PFR. Since the circuit configuration of output main amplifier circuit 3ai and its operation are the same as the conventional one shown in FIG. 6, the description is not repeated.

Figure 3:
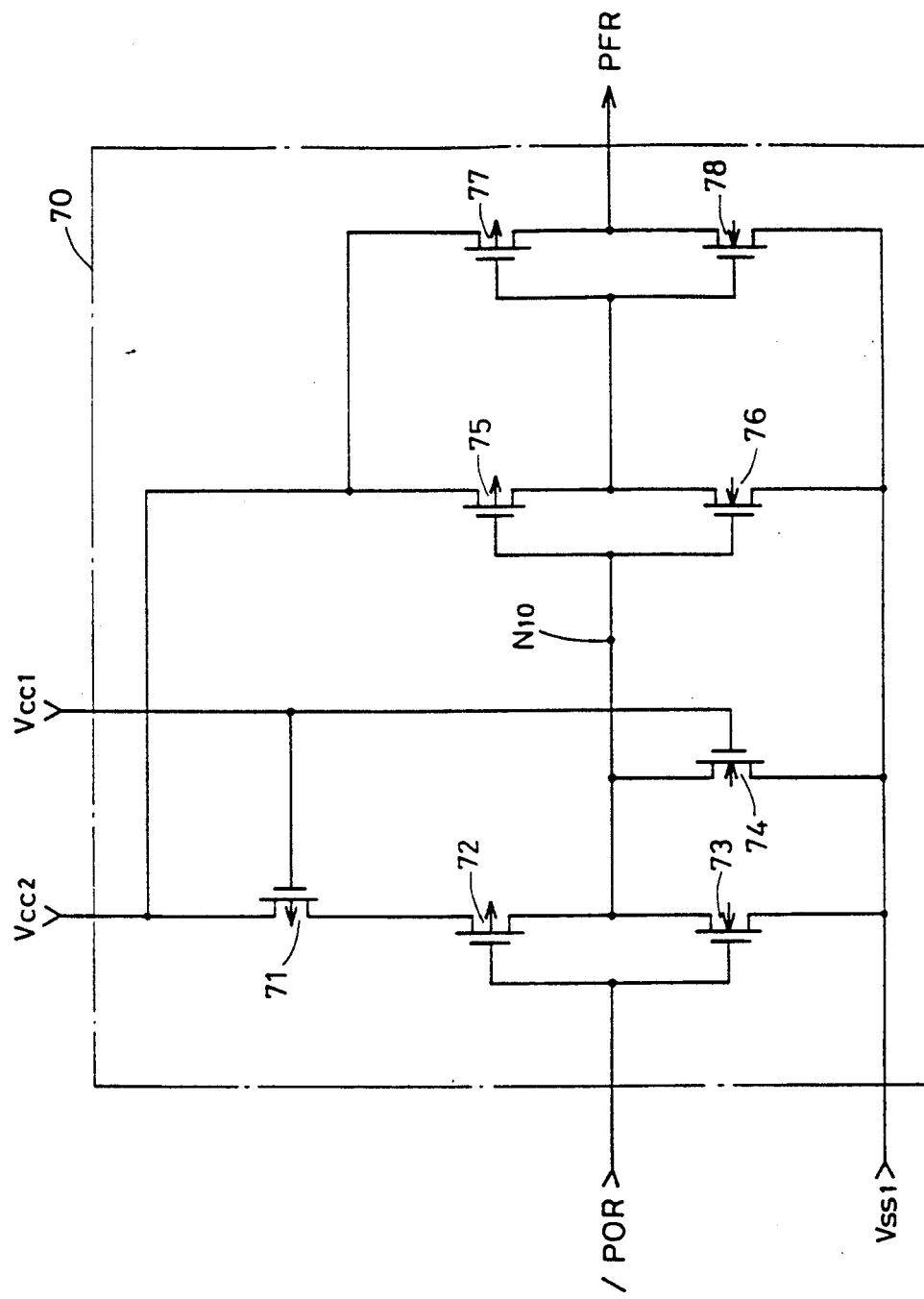
FIG. 3 is a circuit diagram of a power supply failure detecting circuit shown in FIG. 2.

FIG. 3 is a circuit diagram of power supply failure detecting circuit 70 shown in FIG. 2. Referring to FIG. 3, power supply failure detecting circuit 70 comprises PMOS transistors 71, 72, 75 and 77, and NMOS transistors 73, 74, 76 and 78. Transistors 71, 72, 73, and 74 construct an NOR circuit. NOR circuit is supplied with power supply voltage Vcc2. NOR circuit have one input connected to receive a power on reset signal /POR, and have another input connected to receive power supply voltage Vcc1. Transistors 71 and 74 have their gates connected to receive first power supply voltage Vcc1. Two inverters are constructed by transistors 75 and 76, and transistors 77 and 78, and second power supply voltage Vcc2 is applied to the two cascaded inverters. Power supply failure detecting signal PFR is generated through a common connection node of transistors 77 and 78.

Figure 4:
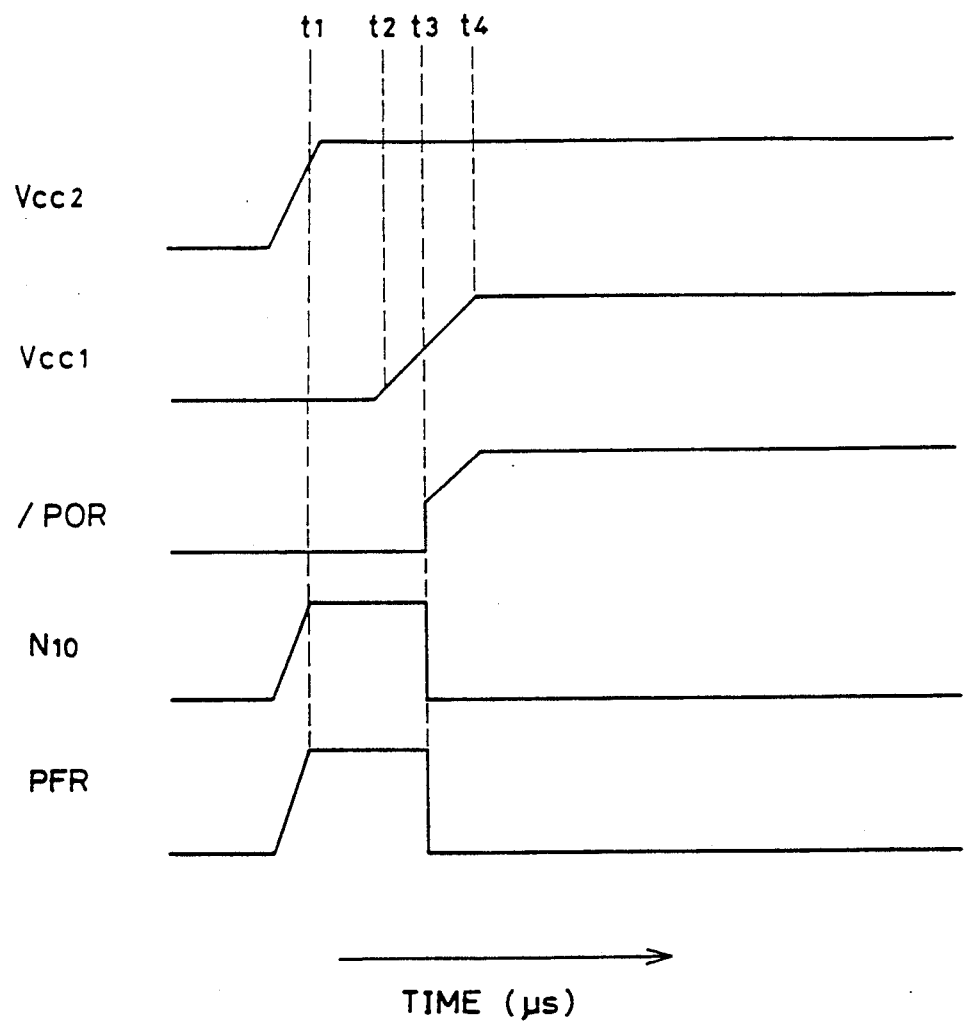
FIG. 4 is a timing chart for describing the operation of a power supply failure detecting circuits shown in FIG. 3.

FIG. 4 is a timing chart for describing the operation of power supply failure detecting circuit 70 shown in FIG. 3. Referring to FIGS. 3 and 4, the operation will be described hereinafter. In the following description, let us assume that the second power supply voltage Vcc2 is supplied at first and the first power supply voltage Vcc1 is supplied with a delay. At the time t1, the supply of power supply voltage Vcc2 starts to supply. At the time t2, power supply voltage Vcc1 starts to supply. A POR circuit 69 shown in FIG. 2 raises power on reset signal POR at the time t3 in response to the rise of power supply voltage Vcc1. Power supply voltage Vcc1 attains a complete level at the time t4.

Until signal /POR rises, that is, until the time t3, a low level signal /POR is applied to power supply failure detecting circuit 70. In the period from the time t1 to t3, second power supply voltage Vcc2 is already fully risen, but first power supply voltage Vcc1 has not yet been fully risen. Therefore, transistors 71 and 74 shown in FIG. 3 are turned on and off, respectively, in response to a low level power supply voltage Vcc1. As a result, in this period, a high level power supply failure detecting signal PFR is provided, since node N10 is brought to a high level.

Since signal /POR rises at the time t3, the potential of node N10 turns to a low level. Accordingly, after the time t3, a low level power supply failure detecting signal PFR is provided. After the time t4, transistor 74 is turned on, since first power supply voltage Vcc1 is established. Therefore, signal PFR is maintained at a low level because the potential of node N10 is fixed to a low level. From the operation mentioned above, it is recognized that a high level power supply failure detecting signal PFR is provided until the rise of first power supply voltage Vcc1, and a low level signal PFR is provided after the rise of power supply voltage Vcc1.

Referring to FIG. 1, transistors 35 and 36 provided in potential fixing circuit 3bi are turned on in response to a high level power supply failure detecting signal PFR before first power supply voltage Vcc1 rises. Accordingly, the gates of driving transistors Q1 and Q2 provided in driving circuit 4i are fixed to ground potential Vss1. As a result, undesired current consumption is avoided, since a penetrating current does not flow from power supply voltage Vcc2 to ground Vss2. Furthermore, destruction of driving transistors Q1 and Q2 by an excessive penetrating current is avoided. Furthermore, because output terminal DQi is not connected to Vcc2 or Vss 2 through transistors Q1 or Q2 having a low resistance, other circuits or devices connected to output terminal DQi are not influenced.

As mentioned above, the output node of output main amplifier circuit 3ai, which may possible generate unstable output signals S1 and S2, is fixed to ground potential Vss1 until first power supply voltage Vcc1 is established. In the above description, an embodiment in which the present invention is applied to a DRAM is described, but it should be noted that the present invention can be applied in other semiconductor memories such as SRAM. In other words, it should be noted that the present invention is widely applicable in the semiconductor memory including a data output driving circuit supplied with an additional power supply voltage. Therefore, it is possible to decrease the current consumed when main power supply voltage is not applied in those semiconductor memories.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device receiving externally applied first and second power supply voltages, said first power supply voltage may not be applied when said second power supply voltage is applied, comprising:

memory cells arranged in rows and columns;

amplifier means supplied with said first power supply voltage for amplifying a data signal read out from said memory cells and for providing an amplified signal, said amplifier means providing an unstable output signal having an unstable potential when said first power supply voltage is not applied;

a data output terminal;

driving means supplied with said second power supply voltage for driving a load connected to said data output terminal in response to the amplified signal provided form said amplifier means, said driving means consuming more current when said amplifier means provides said unstable output signal;

power supply failure directing means supplied with the first and second power supply voltages for detecting failure of said first power supply voltage; and potential fixing means for fixing a potential of the amplified signal provided from said amplifier means to a predetermined potential in response to said power supply failure detecting means.

2. The semiconductor memory device according to claim 1, wherein said power supply failure detecting means comprises:

power on reset signal generating means supplied with said first power supply voltage for generating a power on reset signal in response to the supply of said first power supply voltage;

voltage establishment detecting means or detecting establishment of said first power supply voltage in response to said power on reset signal and the first power supply voltage to provide a voltage establishment signal; wherein said potential fixing means fixed potential of the amplified signal provided form said amplifier means to said predetermined potential in response to said voltage establishing signal.

3. The semiconductor memory device according to claim 1, wherein said amplifier means comprises complementary data signal generating means supplied with said first power supply voltage for generating mutually inverted first and second complementary data signals in response to the data signal read out from said memory cell;

said amplifier means provides first and second unstable output signals each having an unstable potential when said first power supply voltage is not applied; and said driving means drives load connected to said data output terminal in response to said first and second complementary data signals.

4. The semiconductor memory device according to claim 3, wherein said driving means comprises first and second switching elements connected in series between said second power supply voltage and the ground, operated in response to corresponding first and second complementary signals generated from said complementary data signal generating means, said first and second switching elements simultaneously rendered conductive in response to first and second unstable output signals provided from said amplifier means, and consuming more current.

5. The semiconductor memory device according to claim 3, wherein said complementary data signal generating means comprises first and second output nodes for providing said first and second complementary data signals, respectively;

said predetermined potential comprises ground potential; and said potential fixing means includes;

a third switching element connected between said first output node and the ground, and turned on in response to said power supply failure detecting means, and a fourth switching element connected between said second output node and the ground, and turned on in response to said power supply detecting means.

6. The semiconductor memory device according to claim 1, wherein said semiconductor memory device comprises a dynamic random access memory device.

7. A semiconductor memory device receiving externally applied first and second power supply voltages and having n-bits configurations, said first power supply voltage may not be applied when said second power supply voltage is applied, comprising:

memory cells arranged in rows and columns;

n amplifier means supplied with first power supply voltage for amplifying n data bit signals read out from said memory cells to provide n amplified signals, said n amplifier means providing n unstable output signals having an unstable potential when said first power supply voltage is not applied;

n data output terminals;

n driving means each receiving said second power supply voltage for driving a load connected to corresponding one of said data output terminals in response to the amplified signal provided from corresponding said amplifier means;

each said driving means consuming more current when said corresponding amplifier means provides said unstable output signal;

power supply failure detecting means supplied with the first and second power supply voltages for detecting failure of said first power supply voltage; and power fixing mans for fixing a potential of then amplified signals provided from said n amplifier means to a predetermined potential in response to said power supply failure detecting means.

8. The semiconductor memory device according to claim 7, wherein said semiconductor memory device comprises a dynamic random access memory device having n bits configurations.

* * * * *